United States Patent
Tsuge (10) Patent No.: US 9,901,020 B2
(45) Date of Patent: Feb. 20, 2018

(54) NOZZLE MANAGING SYSTEM

(71) Applicant: FUJI MACHINE MFG. CO., LTD., Chiryu (JP)

(72) Inventor: Kuniaki Tsuge, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/513,074

(22) PCT Filed: Oct. 16, 2014

(86) PCT No.: PCT/JP2014/077515
§ 371 (c)(1),
(2) Date: Mar. 21, 2017

(87) PCT Pub. No.: WO2016/059694
PCT Pub. Date: Apr. 21, 2016

(65) Prior Publication Data
US 2017/0303449 A1    Oct. 19, 2017

(51) Int. Cl.
*G06F 7/00* (2006.01)
*H05K 13/04* (2006.01)
*B25J 15/04* (2006.01)

(52) U.S. Cl.
CPC .......... *H05K 13/0408* (2013.01); *B25J 15/04* (2013.01)

(58) Field of Classification Search
USPC ........................................................ 700/228
See application file for complete search history.

(56) References Cited

U.S. PATENT DOCUMENTS

| 5,727,311 A    * | 3/1998 | Ida ........................ H05K 13/021 29/740 |
| 2001/0047586 A1* | 12/2001 | Kawai ................ H05K 13/0413 29/833 |
| 2003/0053300 A1* | 3/2003 | Suhara ................. H05K 13/021 361/760 |
| 2013/0212876 A1* | 8/2013 | Shimizu ............. H05K 13/0069 29/739 |

FOREIGN PATENT DOCUMENTS

| WO | 2014/068673 A1 | 5/2014 |
| WO | 2014/069016 A1 | 5/2014 |

OTHER PUBLICATIONS

International Search Report dated Jan. 20, 2015 in PCT/JP2014/077515 Filed Oct. 16, 2014.

* cited by examiner

*Primary Examiner* — Kyle Logan
(74) *Attorney, Agent, or Firm* — Oblon, McClelland, Maier & Neustadt, L.L.P.

(57) ABSTRACT

A nozzle managing system in which suction nozzles can be suitably transferred is provided. A nozzle managing machine includes a tray holding section that holds a tray, a palette accommodation device as a nozzle stocker, and a nozzle transfer device that transfers the suction nozzles between the tray and the palette accommodation device. In addition, the nozzle managing machine acquires tray information that is information indicating the tray T held in the tray holding section, acquires nozzle information corresponding to the tray T on the basis of the tray information and JOB information stored in a memory section of a host PC, and controls the nozzle transfer device on the basis of the nozzle information.

4 Claims, 11 Drawing Sheets

PICKUP PREVENTION STATE

(a)

PICKUP ALLOWABLE STATE

(b)

PICKUP PREVENTION STATE (c)

NOZZLE MANAGING INFORMATION

| NOZZLE TYPE INFORMATION | PALETTE IDENTIFICATION INFORMATION | PLACEMENT POSITION INFORMATION |
|---|---|---|
| ND(1) | PID(1) | A(1), A(2)·· |
| ND(2) | PID(3) | A(10), A(11)·· |
| ND(a) | PID(4) | A(6), A(7)·· |
| ND(b) | PID(2) | A(1), A(2)·· |
| ⋮ | ⋮ | ⋮ |

(a) PRODUCTION PLAN JOB INFORMATION

| JOB NAME | MOUNTING MACHINE | TRAY INFORMATION | NOZZLE INFORMATION | | COMPLETION/ INCOMPLETION |
|---|---|---|---|---|---|
| JOB(a) | 4A | TD(a) | ND(a)·· | NP(a)·· | COMPLETION |
| JOB(b) | 4B | TD(b) | ND(b)·· | NP(b)·· | COMPLETION |
| JOB(c) | 4C | TD(c) | ND(c)·· | NP(c)·· | COMPLETION |
| ⋮ | | | | | |
| JOB(1) | 4A | TD(1) | ND(1)·· | NP(1)·· | COMPLETION |
| JOB(2) | 4B | TD(2) | ND(2)·· | NP(2)·· | INCOMPLETION |
| JOB(3) | 4C | TD(3) | ND(3)·· | NP(3)·· | INCOMPLETION |
| JOB(x) | 4x | TD(x) | ND(x)·· | NP(x)·· | INCOMPLETION |

(b) JOB LIST

| JOB NAME | COMPLETION/ INCOMPLETION |
|---|---|
| JOB(a) | COMPLETION |
| JOB(b) | COMPLETION |
| JOB(c) | COMPLETION |
| ⋮ | |
| JOB(1) | COMPLETION |
| JOB(2) | INCOMPLETION |
| JOB(3) | INCOMPLETION |
| JOB(x) | INCOMPLETION |

NOZZLE MANAGING SYSTEM

TECHNICAL FIELD

The present application relates to a nozzle managing system that manages suction nozzles that are used in a mounting machine.

BACKGROUND ART

In a nozzle managing system disclosed in PTL 1, transfer of the suction nozzles from a nozzle stocker to a nozzle placing device is automatically performed on the basis of nozzle information that is information about the suction nozzles supplied from a host PC to a nozzle managing machine.

CITATION LIST

Patent Literature

PTL 1: Pamphlet of International Publication No. 2014/069016

SUMMARY

An object of the present disclosure is to improve a nozzle managing system, for example, to ensure that transfer of nozzles is suitably performed.

Advantageous Effects

In the nozzle managing system of the disclosure, nozzle information is acquired on the basis of at least one of an input of an operator and nozzle placing device information indicating a nozzle placing device, and work plan information, and transfer of nozzles is controlled on the basis of the nozzle information. As a result, it is possible to suitably transfer a suction nozzle intended by the operator to the nozzle placing device or to suitably transfer a suction nozzle determined by nozzle placing device information to the nozzle placing device.

Moreover, PTL 1 does not describe a method of determining nozzle information.

BRIEF DESCRIPTION OF DRAWINGS

FIGS. 4(a) to 4(c) are views illustrating a tray T in which nozzles are placed in a mounting machine, in which

FIGS. 8(a) to 8(c) are views illustrating a palette in which nozzles are accommodated in the nozzle managing machine. FIG. 8 (a) is a plan view illustrating a pickup prevention state.

DESCRIPTION OF EMBODIMENTS

Hereinafter, an electric component mounting system according to an embodiment will be described with reference to the drawings.

First Embodiment

Figure 1:
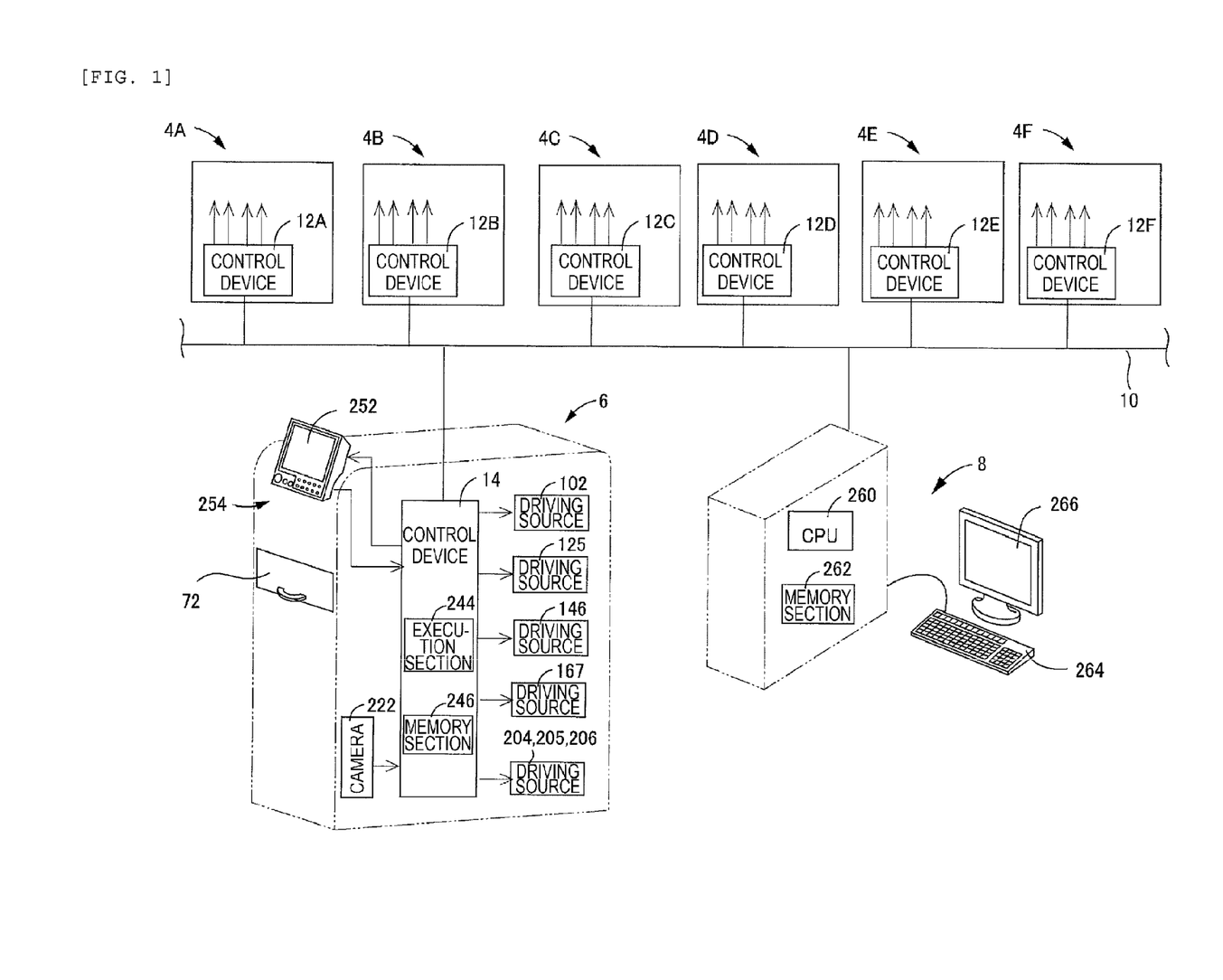
FIG. 1 is a view schematically illustrating an entire electric component mounting system including a nozzle managing system of an embodiment.

As illustrated in FIG. 1, the electric component mounting system includes (a) mounting machines 4 as multiple electric component mounting machines, (b) a nozzle managing machine 6, (c) a host computer (hereinafter, abbreviated as host PC) 8, (d) a bus 10, and the like. Each of multiple control devices 12 included in each of multiple mounting machines 4, a control device 14 of the nozzle managing machine 6, and the host PC 8 are communicably connected via the bus 10. In a case where each of the multiple mounting machines 4 and the multiple control devices 12 is distinguished, reference symbols A, B, . . . are added to distinguish them. If it is not necessary to distinguish them such as a case where a generic name is used for them, it is expressed without giving reference symbols A, B, . . . . In addition, a basic structure of the electric component mounting system is described in PTL 1 (Pamphlet of International Publication No. WO2014069016A1).

Mounting Machine

Figure 2:
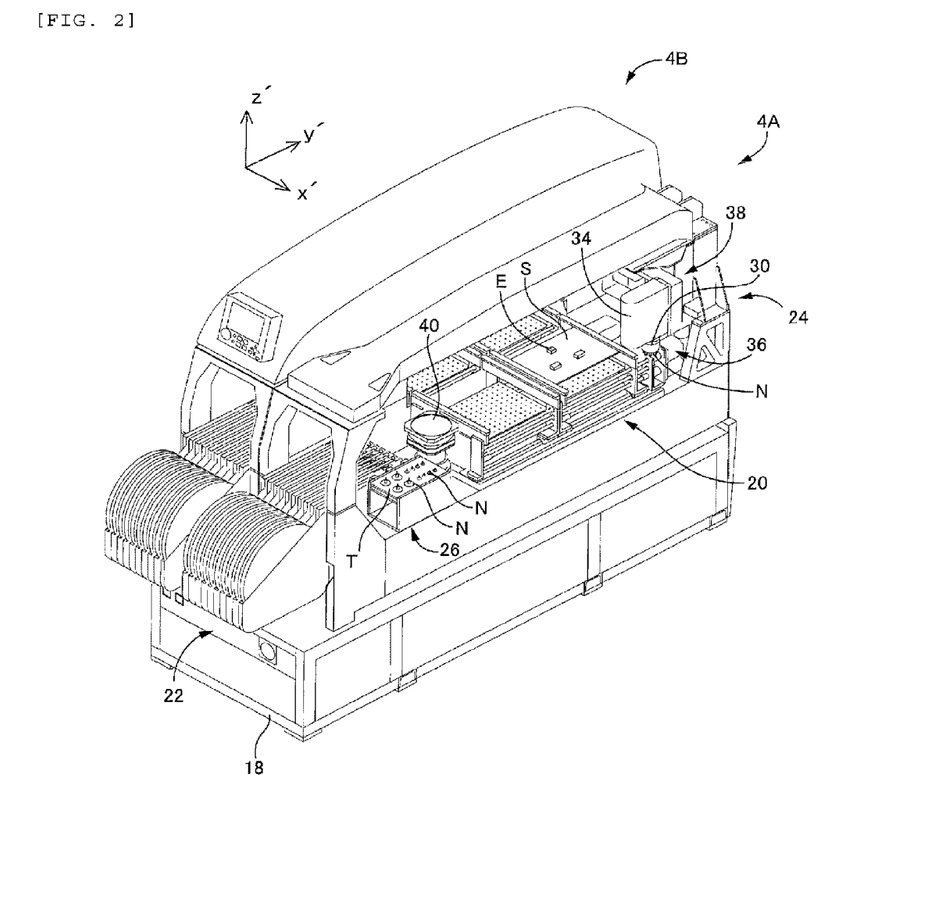
FIG. 2 is a perspective view of a mounting machine in which suction nozzles to be managed by the nozzle managing system are used.

The mounting machine 4 performs amounting work (JOB) that mounts an electric component E (hereinafter, simply referred to as component) on a circuit board (hereinafter, simply referred to as board) S using a suction nozzle (hereinafter, simply referred to as nozzle) N, and an example is illustrated in FIG. 2.

As illustrated in FIG. 2, two mounting machines 4A and 4B having the same structure are provided in a common base 18. Each of the two mounting machines 4A and 4B includes (a) a board conveyance and holding device 20 that conveys the board S in a conveyance direction x' and holds the board S in a setting position, (b) a component supplying device 22 that supplies the component E, (c) a component mounting device 24 that mounts the component E supplied by the component supplying device 22 on the board S, (d) a tray holding table 26 as a nozzle placing device mounting holding section that detachably holds a tray T as the nozzle placing device in which multiple nozzles N are accommodated, (e) the control device 12 that has a computer as a main body and controls the board conveyance holding device 20, the component mounting device 24, and the like.

The component supplying device 22 can have, for example, multiple tape feeders. The component mounting device 24 includes a mounting head 36 including (i) a nozzle holding section 30 that holds multiple nozzles N and a holding section lifting and lowering rotation device 34 that moves the nozzle holding section 30 in an up-down direction z' and rotates the nozzle holding section 30 around a center axis, and (ii) a mounting head moving device 38 that moves the mounting head 36 in the conveyance direction x' of the board S, in a width direction y', and the up-down direction z'. The component E supplied by the component supplying device 22 is sucked and held by the nozzle N, is moved above the board S, and then suction and holding is released to be mounted on the board S. Reference numeral 40 is a component camera. The component E that is sucked and held by the nozzle N is imaged by the component camera 40 and information about a relative position, a posture (direction) of the component with respect to the nozzle N is acquired.

Figure 3:
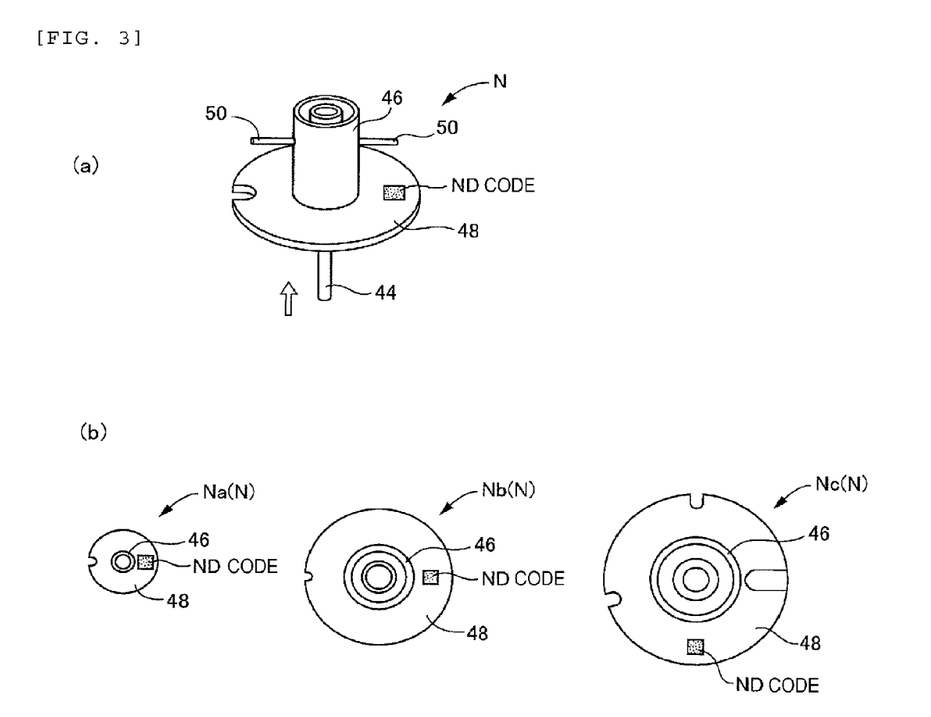
FIG. 3(a) is a perspective view illustrating the suction nozzle.
FIG. 3(b) is a plan view illustrating multiple types of suction nozzles.

As illustrated in FIG. 3(*a*), the nozzle N includes (1) a suction pipe 44, (2) a main body 46 that holds the suction pipe 44, and (3) a flange 48 that is provided in an intermediate portion of the main body 46. The nozzle N is held in the nozzle holding section 30 using a locking pin 50 provided in the main body 46.

The suction pipe 44 is connected to an air source (not illustrated) via the nozzle holding section 30 and the like, and a negative pressure and a positive pressure are selectively supplied on the suction pipe 44. The component E is sucked and held by supplying of the negative pressure and the component E that is sucked and held is released by the supply of the positive pressure. A 2D code (hereinafter, may be referred to as an ND code) indicating a type of the nozzle N is attached to an upper face of the flange 48. For example, a label with the ND code can be affixed.

For example, as illustrated in FIG. 3(*b*), there are multiple types of the nozzles N having different diameters (sizes) of the suction pipe 44, and the like {three types of nozzles Na, Nb, and Nc are illustrated in FIG. 3 (*b*)}. The type of the nozzle N used in each of the mounting machines 4 is determined by the size and a shape of the component E mounted on each of the mounting machines 4, and the like. One or more types of the nozzles N that is determined by the mounted component E is installed in the tray T and the like held by the tray holding table 26 in the mounting machine 4. A nozzle N that is suitable for the component E is attached to the nozzle holding section 30 in advance prior to the start of the mounting work from one or more types of the nozzles N installed in the tray T. Therefore, although mounting of the component E is performed by selectively using the multiple nozzles N held in the nozzle holding section 30, in a case where the mounting work is completed, the nozzle N held in the nozzle holding section 30 is returned to the tray T. Therefore, in a setup change, the tray T is replaced with a tray T on which a nozzle N used in a next mounting work is placed.

Figure 4:
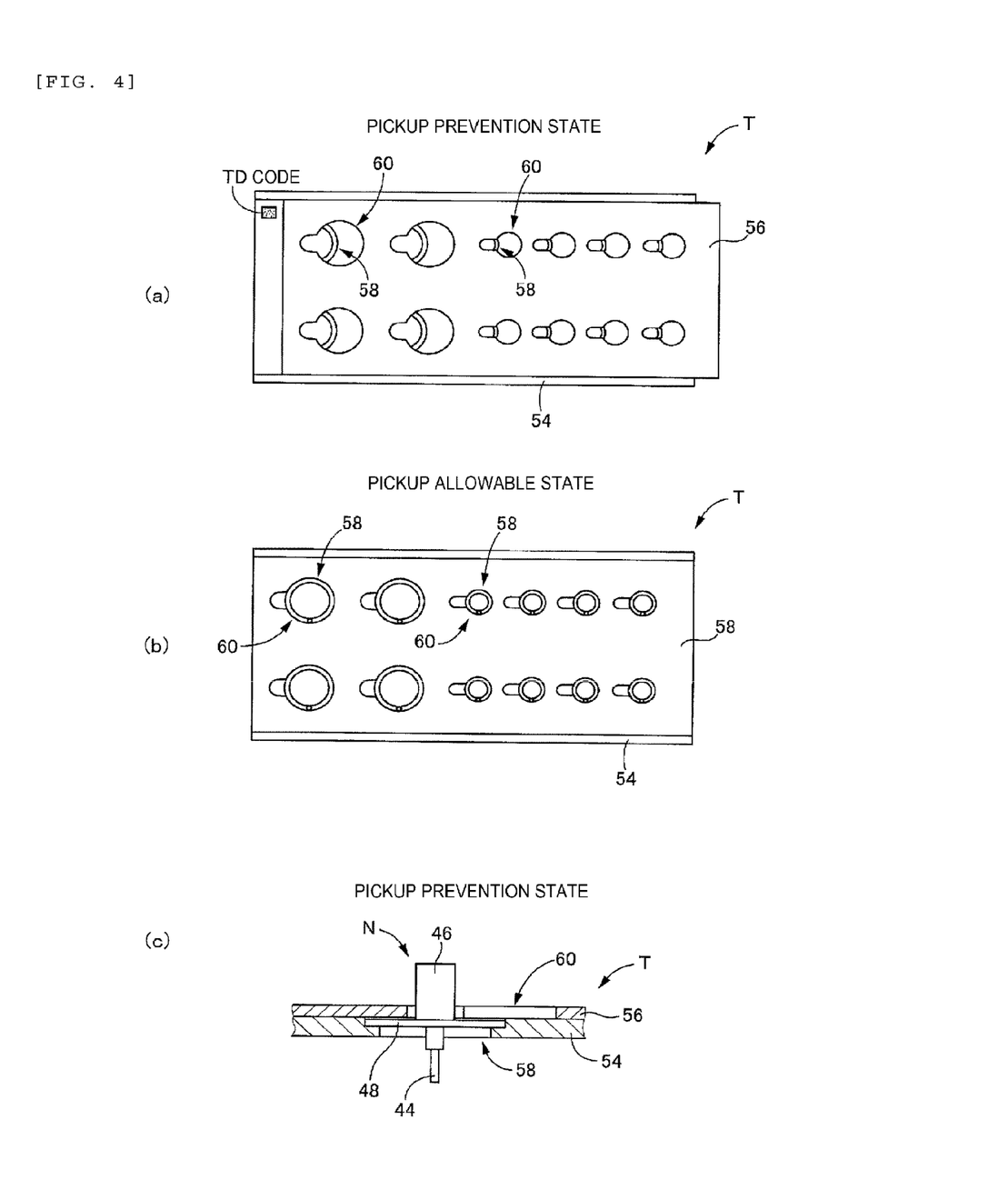
FIG. 4(a) is a plan view illustrating a pickup prevention state.
FIG. 4(b) is a plan view illustrating a pickup allowable state.
FIG. 4(c) is a partial sectional view (state where nozzles are accommodated).

As illustrated in FIGS. 4(*a*) and 4(*b*), the tray T includes a base plate 54 and a cover plate 56 that is slidable with respect to the base plate 54. Multiple placing holes 58 are formed in the base plate 54 and as illustrated in FIG. 4 (*c*), the nozzles N are accommodated in a predetermined posture. The placing holes 58 are provided corresponding to one type or the multiple types of nozzles N and the type of the held nozzle N is determined by a size of the placing hole 58 or the like.

Multiple escape holes 60 corresponding to the placing holes 58 of the base plate 54 are formed in the cover plate 56. The escape hole 60 has a shape including a circular hole having a large diameter and an elongated long hole. In a state where the nozzle N is held by the placing hole 58, a relative movement of the cover plate 56 is allowed by the long hole. The tray holding table 26 is provided with a cover slide device (not illustrated) for sliding the cover plate 56 with respect to the base plate 54.

As illustrated in FIG. 4 (*b*), in the tray T, the circular hole of the escape hole 60 and the placing hole 58 are substantially matched in a plan view by the relative movement of the cover plate 56 with respect to the base plate 54. A pickup allowable state in which the pickup of the nozzle N accommodated in the placing hole 58 and a pickup prevention state in which as illustrated in FIG. 4(*a*), the circular hole of the escape hole 60 and the placing hole 58 are deviated in a plan view, and the pickup of the nozzle N is prevented are switched to each other. In the cover plate 56, the circular hole of the escape hole 60 is biased by a spring to a position deviated from the placing hole 58 in a plan view so that the tray T is in the pickup prevention state in a normal state.

Moreover, in the tray T, the 2D code (hereinafter, may be referred to as a TD code) indicating the type of the tray T is attached to a recognizable position in the pickup prevention state of the base plate 54. Although there is a case where both the TD code indicating the type and an ID code indicating individual identification information are attached to the tray T, in the example, a case where the TD code is used is described. In addition, multiple trays T may also be held in the mounting machine 4.

Nozzle Managing Machine

Figure 5:
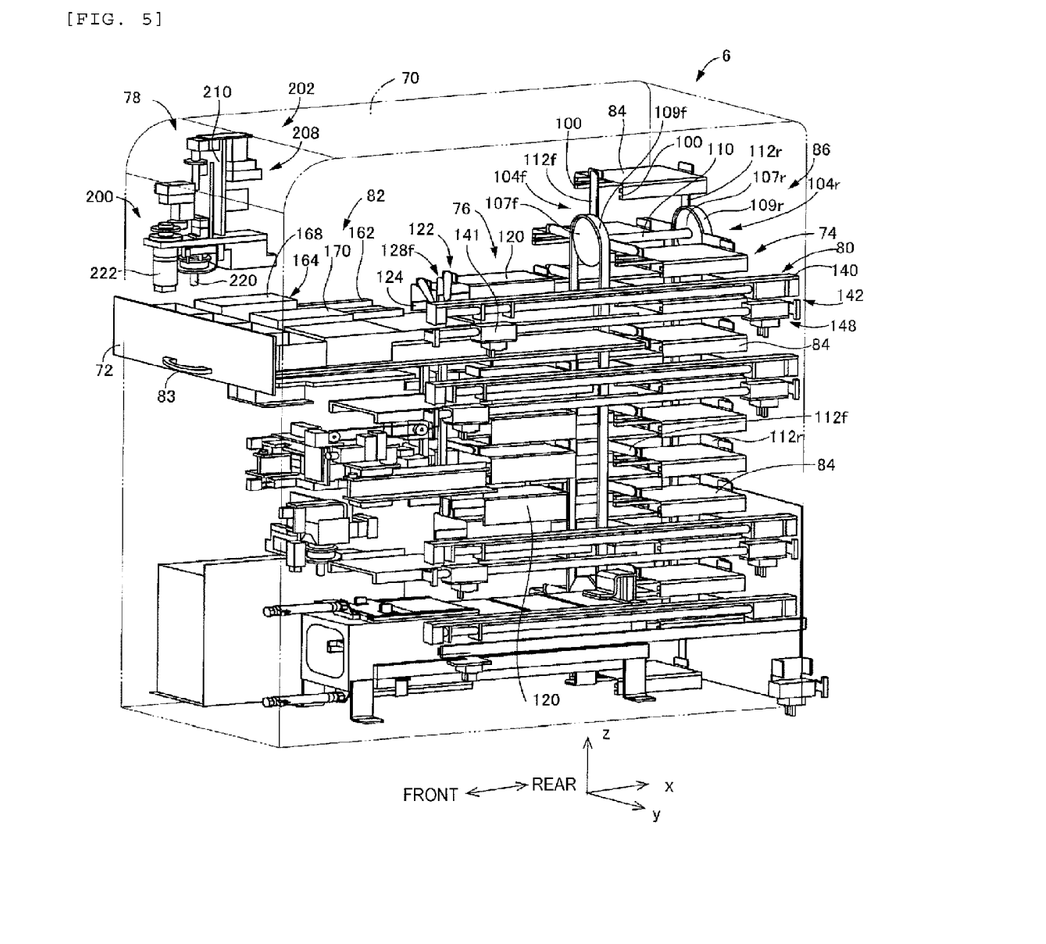
FIG. 5 is a perspective view illustrating an internal structure of a nozzle managing machine of the nozzle managing system.
Figure 6:
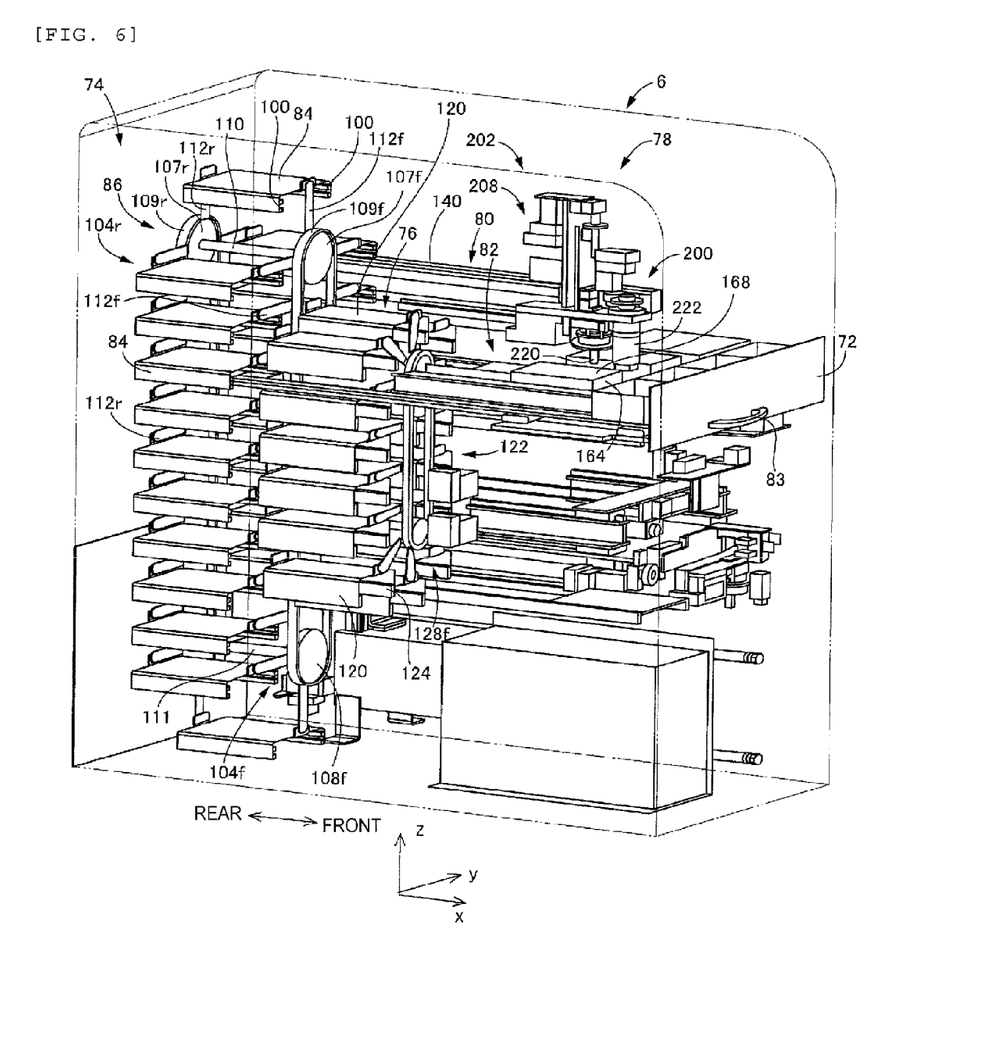
FIG. 6 is another perspective view illustrating the internal structure of the nozzle managing machine.
Figure 7:
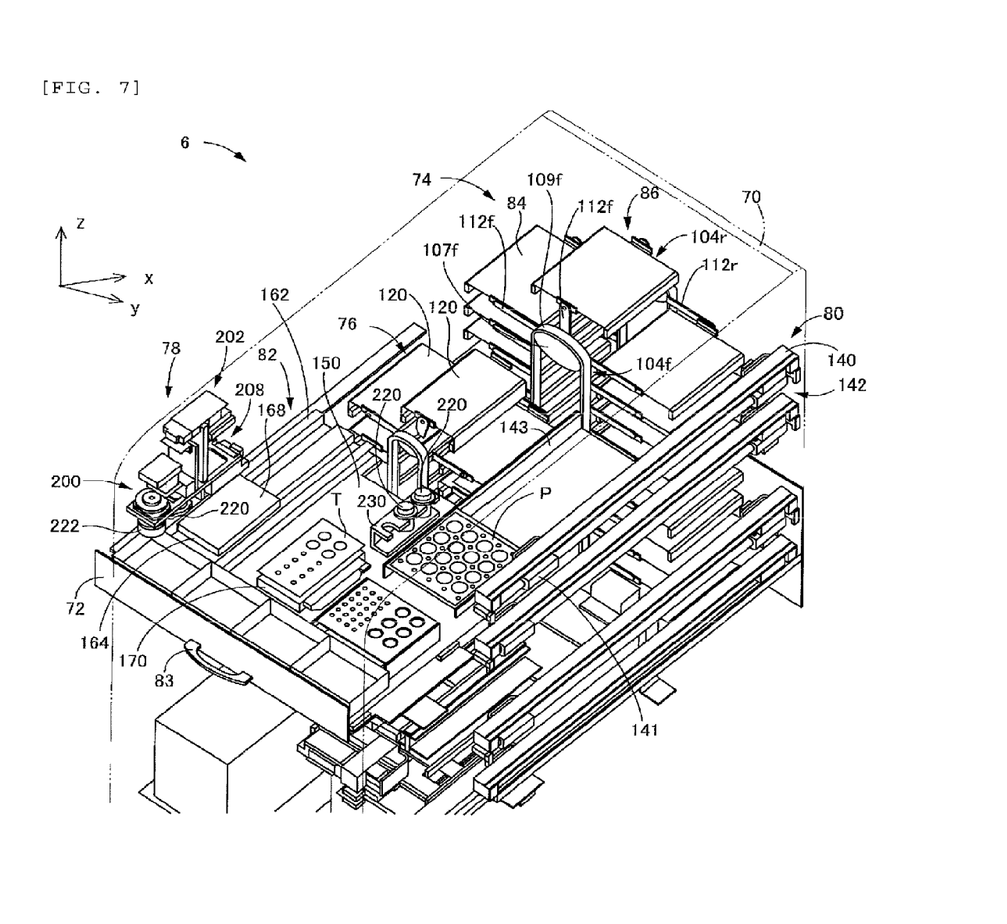
FIG. 7 is a plan view illustrating the internal structure of the nozzle managing machine.

The nozzle managing machine 6 is provided to manage the nozzles N used in the mounting machine 4 and as illustrated in FIGS. 5 to 7, includes (a) a main body 70, (b) a drawer 72 that is relatively movable with respect to the main body 70, (c) a palette accommodation device 74 as a nozzle stocker, (d) a tray accommodation device 76, (e) a nozzle transfer device 78, (f) a palette moving device 80, (g) a tray moving device 82, and the like. In addition, the nozzle managing machine 6 also includes a nozzle inspection device, a nozzle cleaning device, a nozzle drying device, and the like, but since those devices are no relation with the disclosure, the description thereof will be omitted.

In the nozzle managing machine 6, a front-back direction (movement direction of palette and the tray T) is referred to as x, an up-down direction is referred to as z, and a width direction of the nozzle managing machine 6 is referred to as y. The x, y, and z-directions are orthogonal to each other. A pair of guides (not illustrated) extending in the x-direction to be spaced in the y-direction is provided and the drawer 72 that is relatively movable in the x-direction (front-back direction) along the pair of guides is provided in a front portion of the main body 70. A handle 83 is attached to a front face of the drawer 72. In addition, the palette accommodation device 74, the tray accommodation device 76, and the nozzle transfer device 78 are provided to be spaced in the x-direction, the palette moving device 80 is provided between a work region of the nozzle transfer device 78 and the palette accommodation device 74, and a tray moving device is provided between the work region of the nozzle transfer device 78 and the tray accommodation device 76.

[Palette Accommodation Device]

The palette accommodation device 74 accommodates multiple palettes P on which the nozzles N are placed and includes multiple carriers 84 and a carrier lifting and lowering device 86 that causes the multiple carriers 84 to revolve while being moved in the up-down direction. One palette P is accommodated in each of the multiple carriers 84.

Figure 8:
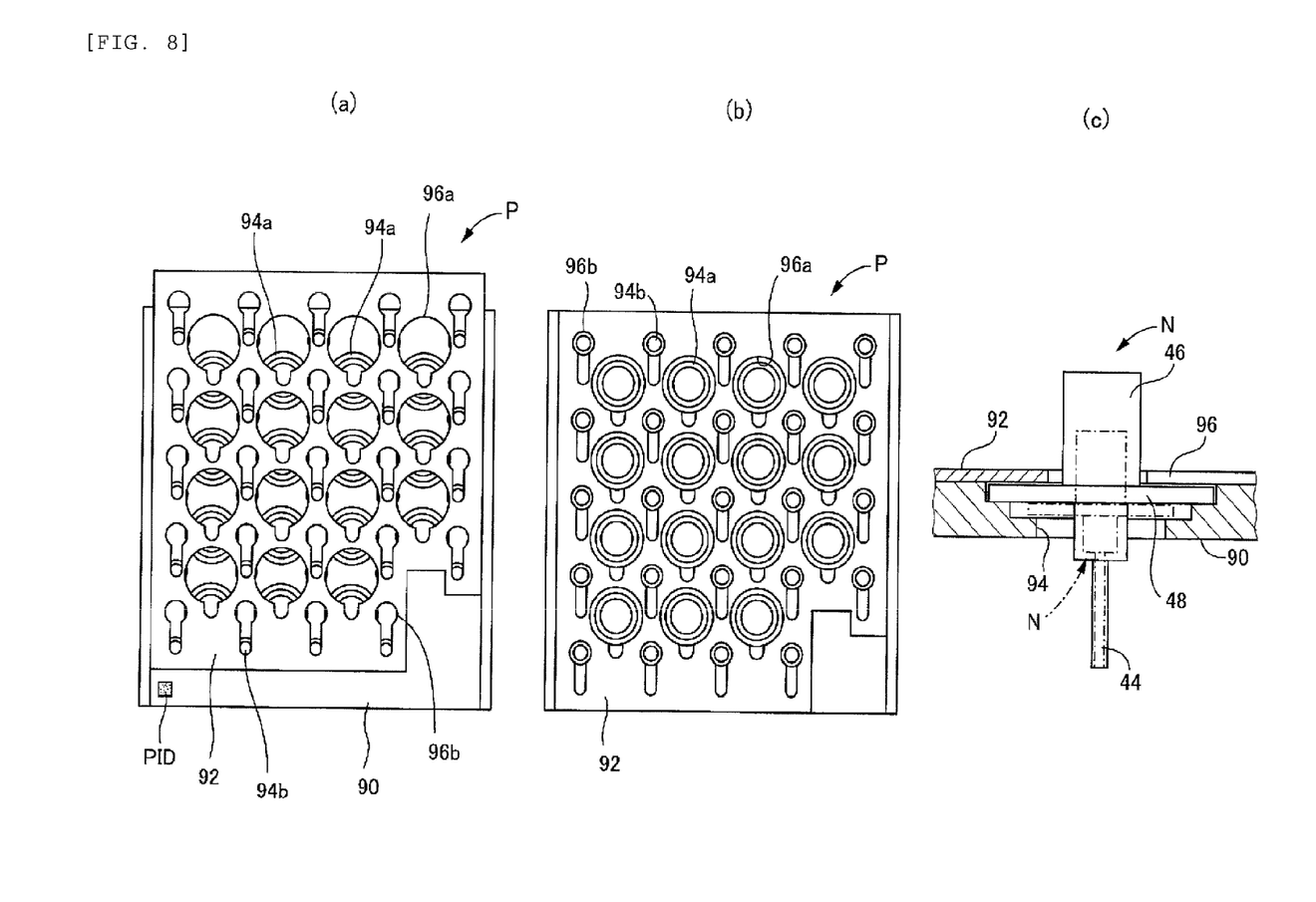

As illustrated in FIGS. 8(a) and 8(b), similar to the tray T described above, the palette P includes a base plate 90 and a cover plate 92. Multiple placing holes 94a and 94b are formed in the base plate 90 and multiple escape holes 96a and 96b are formed in the cover plate 92. In the palette P, a pickup prevention state illustrated in FIG. 8(a) in which pickup of the nozzle N is prevented and, a pickup allowable state illustrated in FIG. 8(b) in which the pickup of the nozzle N is allowed are switched by the relative movement of the cover plate 92 with respect to the base plate 90. As illustrated in FIG. 8(c), each of the placing holes 94a and 94b has a stepped shape. In a case where the flange 48 of the nozzle N abuts against a large diameter stepped surface and in a case where the flange 48 of the nozzle N abuts against a small diameter stepped surface, the multiple types of nozzles N different from each other can be held.

Moreover, a 2D code (hereinafter, may be referred to as a PID code) indicating a panel ID that is unique identification information of the palette P is attached to a recognizable position of the base plate 90 in the pickup prevention state of the palette P.

Each of the carriers 84 is a member of a groove type that opens downward and having a generally U-shaped cross section, and has a pair of side walls and a connecting plate that connects the pair of side walls at an upper end portion. A pair of rails 100 is provided on an inside of a lower end portion of the pair of side walls so as to extend in the x-direction and the palettes P are accommodated in the pair of rails 100 one by one to be movable in the x-direction.

The carrier lifting and lowering device 86 includes an electric motor 102 as a driving source illustrated in FIG. 1 and a pair of sprocket driving transmission sections 104*f* and 104*r* provided to be spaced in the front-back direction x. The pair of sprocket driving transmission sections 104*f* and 104*r* respectively include upper sprockets 107*f* and 107*r* provided to be spaced in the up-down direction z, lower sprockets 108*f* and 108*r* (sprocket 108*r* is not illustrated), and chains 109*f* and 109*r* wound around each of the upper and lower sprockets 107*f* and 108*f*, and 107*r* and 108*r*. The chains 109*f* and 109*r* extend generally in the up-down direction. In addition, the upper sprockets 107*f* and 107*r*, and the lower sprockets 108*f* and 108*r* are connected by sprocket shafts 110 and 111 extending in the x-direction respectively.

In addition, multiple holding rods 112*f* and 112*r* are respectively provided in a pair of chains 109*f* and 109*r* to protrude on an outer peripheral side with equal intervals. One carrier 84 is rotatably held in the connecting plate in each of the pair of holding rods 112*f* and 112*r*. The multiple carriers 84 respectively cause the connecting plate to revolve while being moved in the up-down direction along the chains 109*f* and 109*r* to keep a posture that the connecting plate is on an upper side.

[Tray Accommodation Device]

The tray accommodation device 76 is a device that accommodates the multiple trays T and includes multiple carriers 120 and a carrier lifting and lowering device 122. The multiple carriers 120 and the carrier lifting and lowering device 122 have the same structures as those of the carrier 84 and the palette moving device 80 that are constituent elements of the palette accommodation device 74.

A pair of rails 124 extending in the x-direction to be spaced in the y-direction is provided in each carrier 120 and the trays T are accommodated in the pair of rails 124 to be movable in the x-direction. The carrier lifting and lowering device 122 includes an electric motor 125 as a driving source illustrated in FIG. 1 and a pair of sprocket driving transmission sections 128*f* and 128*r*(128*r* is not illustrated). Each of the multiple carriers 120 is revolved while being kept in a posture constant and moving in the up-down direction by the carrier lifting and lowering device 122.

[Palette Moving Device]

The palette moving device 80 delivers the palette P to and from the palette accommodation device 74, and is moved between the palette accommodation device 74 and a predetermined position within a work region of the nozzle transfer device 78. The palette moving device 80 includes (1) a pair of guides 140 provided to extend in the x-direction to be spaced in the y-direction, (2) a shuttle 141, and (3) a shuttle moving device 142. A rail 143 is provided in each of the pair of guides 140. The pair of guides 140 is provided so that a pair of rails 143 and the pair of rails 100 of the carrier 84 of the palette accommodation device 74 are provided so as to be positioned at the same position in the y-direction. In addition, as illustrated in FIG. 7, front end portions of the pair of guides 140 reach an upper side of a table 150 which is a bottom face of the drawer 72 and a rear end portion of one of the pair of guides 140 reaches a rear side of the palette accommodation device 74. The shuttle moving device 142 is provided along the one guide 140.

The shuttle moving device 142 includes an electric motor 146 as a driving source and a driving transmission mechanism 148 that converts the rotation of the electric motor 146 to a linear movement and transmits a driving force to the shuttle 141. The driving transmission mechanism 148 can be, for example, a feeding screw mechanism and the shuttle 141 is engaged with a nut. Although not illustrated, an arm extending generally in the y-direction is attached to the shuttle 141. The arm passes under the guide 140 (carrier 84) and has a shape such that a leading end portion can grip a rear end portion of the palette P.

Each carrier 84 is stopped at a position in which the pair of rails 100 and the pair of rails 143 of the palette moving device 80 are at the same height in the palette accommodation device 74. As a result, the rail 100 and the rail 143 are in a state of being in a straight line and continuously extended. In a case where the palette P is moved from the palette accommodation device 74 to the work region of the nozzle transfer device 78, the shuttle 141 is moved to a rear side of the carrier 84 and is advanced in a state where the leading end of the arm grips the rear end portion of the palette P. The palette P is advanced, discharged to an outside of the carrier 84, is placed on the rail 143, and is passed from the palette accommodation device 74 to the palette moving device 80. The palette P is advanced to a predetermined position within the work region of the nozzle transfer device 78. In a case where the palette P is accommodated in the palette accommodation device 74, a reverse operation is performed. The shuttle 141 is retreated in a state of gripping the rear end portion of the palette P and thereby the palette P is also retreated. The palette P is moved from the rail 143 to the rail 100 and is transferred to the palette accommodation device 74. Thereafter, the palette P is retreated to a retreat end position of the carrier 84.

Moreover, although not illustrated, a cover slide device that moves the cover plate 92 of the palette P is provided in the palette moving device 80.

[Tray Moving Device]

The tray moving device 82 is a device which delivers the tray T between the tray accommodation device 76 and the work region of the nozzle transfer device 78, and is moved between the tray accommodation device 76 and the work region of the nozzle transfer device 78. The tray moving device 82 is provided in the table 150 that is a bottom face of the drawer 72, and includes (1) a pair of rails 162 that extends in the x-direction, (2) a slider moving device that moves a slider 164 which can hold the tray T, and (3) a delivery device (not illustrated) of the tray T which performs delivery of the tray T between the slider 164 and the tray accommodation device 76. The slider moving device includes a driving source 167 illustrated in FIG. 1 and a driving transmission section (not illustrated) which can transmit a driving force of the driving source 167 to the slider 164. A tray holding section 168 is provided at an upper portion of the slider 164 and can detach and attach the tray T.

A tray holding section 170 that is fixedly provided separately from the tray holding section 168 is provided in the table 150 of the drawer 72. In a state where the drawer 72 is pulled out, an operator can attach (hereinafter, may be referred to as set) or detach the tray T from each of the tray holding sections 168 and 170. Moreover, FIG. 7 illustrates a state where the tray T is set in the tray holding section 170. In addition, cover slide devices (not illustrated) that move the cover plate 56 of the set tray T are respectively provided each of the tray holding sections 168 and 170. Moreover, in the example, the tray holding sections 168 and 170 correspond to a nozzle placing device transfer holding section.

[Nozzle Transfer Device]

The nozzle transfer device 78 is a device that transfers the nozzle N between the tray T and the palette P. The nozzle transfer device 78 is disposed above the table 150 and includes a transfer head 200 and a head moving device 202 that moves the transfer head 200 in the x, y, and z-directions respectively. Each head moving device 202 includes an x driving source 204, a y driving source 205, and a z driving source 206 illustrated in FIG. 1, and an x moving mechanism and a y moving mechanism (not illustrated), a z moving mechanism 208, and the like. A slider 210 that holds the transfer head 200 is moved in the x, y, and z-directions by the head moving device 202. A movable area of the transfer head 200 is the work region of the nozzle transfer device 78. As illustrated in FIGS. 5 and 6, the transfer head 200 includes (a) a chuck 220 that holds the nozzle N, (b) a camera 222 that can image the tray T, the nozzle N, the palette P, and the like, (c) a chuck driving mechanism that opens and closes a claw section of the chuck 220 and is rotated around an axis, and the like. The TD code and the like attached to the tray T are acquired on the basis of a captured image captured by the camera 222.

On the other hand, the table 150 is provided with a chuck station 230 (see FIG. 7) and multiple types of chucks 220 are stored in the chuck station 230. In the example, as illustrated in FIG. 3, since the multiple types of nozzles N different from each other are transferred, a chuck suitable for the size of the nozzle N, or the like is used. If necessary, the transfer head 200 is moved to the chuck station 230 and the chuck 220 is exchanged.

[Control Device]

As illustrated in FIG. 1, the nozzle managing machine 6 includes the control device 14 having a computer as a main body including an execution section 244, a memory section 246, and the like. A display 252 as a notifying device, an input device 254, the camera 222, and the like are connected to the control device 14, and each driving source (the electric motor 102, or the like) which is described above is connected to the control device 14. Multiple programs such as a nozzle transfer program indicated in flowchart of FIG. 12, the nozzle managing information illustrated in FIG. 9, or the like is stored in the memory section 246 of the control device 14. The nozzle managing information is information for managing the nozzles N accommodated in the palette accommodation device 74 and can also include (a) nozzle type information ND that is information indicating each type of the nozzles N, (b) palette identification information PID indicating the palette P in which each of the nozzles N is accommodated, (c) placement position information A indicating a position to which the nozzle N on the palette P is transferred, and the like. In addition, the nozzle managing information can include information indicating a frequency of use of the nozzle N or the like.

Host PC

The host PC 8 collectively controls the electric component mounting system and includes a CPU 260, a memory section 262, and the like.

Figure 10:
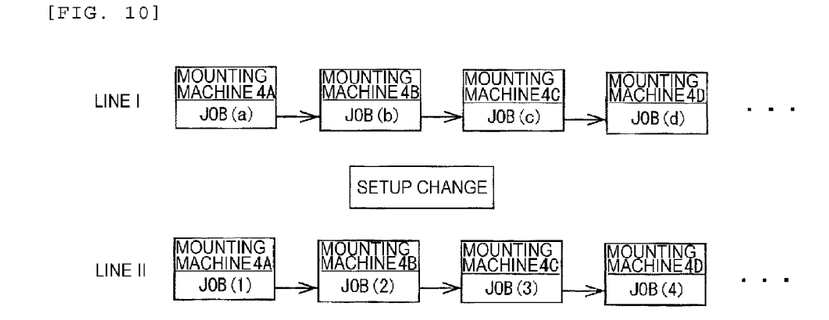
FIG. 10 is a diagram conceptually illustrating work that is performed in the mounting machine.
Figure 11:
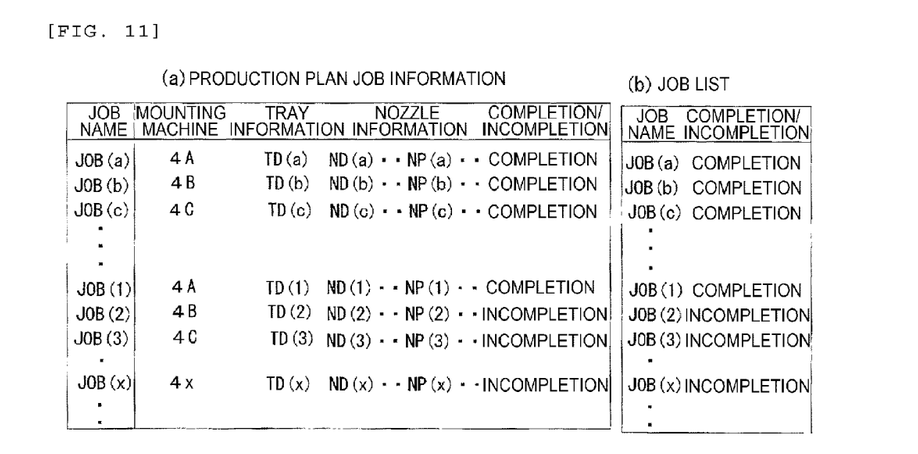
FIG. 11 is a diagram conceptually illustrating JOB information stored in the memory section of a host computer of the nozzle managing system.

Production plan JOB information is input into the memory section 262 in advance and is stored therein as work plan information illustrated in FIG. 11(a). In the example, the production plan JOB information is information about a work plan with respect to each mounting machine 4 and multiple types of information (referred to as JOB information) indicating the mounting work that is performed in each mounting machine in a case where multiple types of electric products are produced by one or more mounting machines 4. For example, as illustrated in FIG. 10, in a plan in which different types of the electric products are produced in order of a line I, a line II, . . . , in a case where in the line I, the mounting work of JOB(a), JOB(b), JOB(c), JOB(d), . . . is performed, and in the line II, the mounting work of JOB(1), JOB(2), JOB(3), JOB(4), . . . is performed in each of the mounting machines 4A, B, C, D, . . . , the production plan JOB information includes JOB (a) information, JOB(b) information, JOB(c) information, . . . , JOB(1) information, JOB(2) information, JOB(3) information, . . . , and the like.

The JOB information is information indicating the mounting work and is indicated by (i) mounting machine information that is information specifying the mounting machine 4 in which the mounting work is performed, (ii) tray information TD that is information indicating the type of the tray T used in the mounting machine 4, (iii) the nozzle type information ND which is described above indicating the type of the nozzle N placed on the tray T, and placement position information NP that is information indicating a placement position of each nozzle N on the tray T, (iv) nozzle transfer completion information {indicated by either of finished (completed) and unfinished (uncompleted)} that is information indicating whether or not the transfer of the nozzle is completed, and the like, and is indicated by a JOB name. Moreover, information including the nozzle type information ND and the nozzle placement position information NP is referred to as nozzle information. In addition, as illustrated in FIG. 11(b), a list in which the JOB name and the nozzle transfer completion information are associated is referred to as a JOB list.

Operation in Electric Component Mounting System

In each mounting machine 4, when the mounting work {for example, the work JOB (a) in the mounting machine 4A} in the line I is completed, the mounting work {JOB(1)} is executed in the line II, but preparation for switching from the mounting work JOB(a) to the mounting work JOB(1), a so-called setup change is performed if necessary. In the setup change, it is troublesome for the operator and it takes a long period of time to replace or mount the nozzle N placed on the tray T. In addition, there are also cases where a nozzle is erroneously placed in manual operation.

Therefore, in the example, the operator may set the tray T that is used in the next mounting work in the tray holding sections 168 and 170, and the transfer of the nozzle N is automatically performed in the nozzle managing machine 6. The tray information TD(i) of the trays T which are set by the tray holding sections 168 and 170 is acquired, the nozzle information {ND(i) and NP(i)} about the nozzle N to be placed on the tray T indicated by the tray information TD(i) is determined on the basis of the tray information TD(i) and the production plan JOB information stored in the memory section 262 of the host PC 8, and the transfer of the nozzle N is performed on the basis of the nozzle information {ND(i) and NP(i)}. In a case where nozzles are placed on the trays T in advance which are placed in the tray holding sections 168 and 170, unnecessary nozzles are removed, are transferred to the palette P, necessary nozzles are transferred from the palette P, and thereby nozzle replacement is performed. In a case where nozzles N are not placed on the trays T which are set in the tray holding sections 168 and 170, unnecessary nozzles are removed, are transferred to the palette P, the nozzles N are transferred to predetermined positions from the palette P to the tray T on the basis of the nozzle information {ND(i) and NP(i)}. Hereinafter, these are referred to as the transfer of the nozzle.

Figure 12:
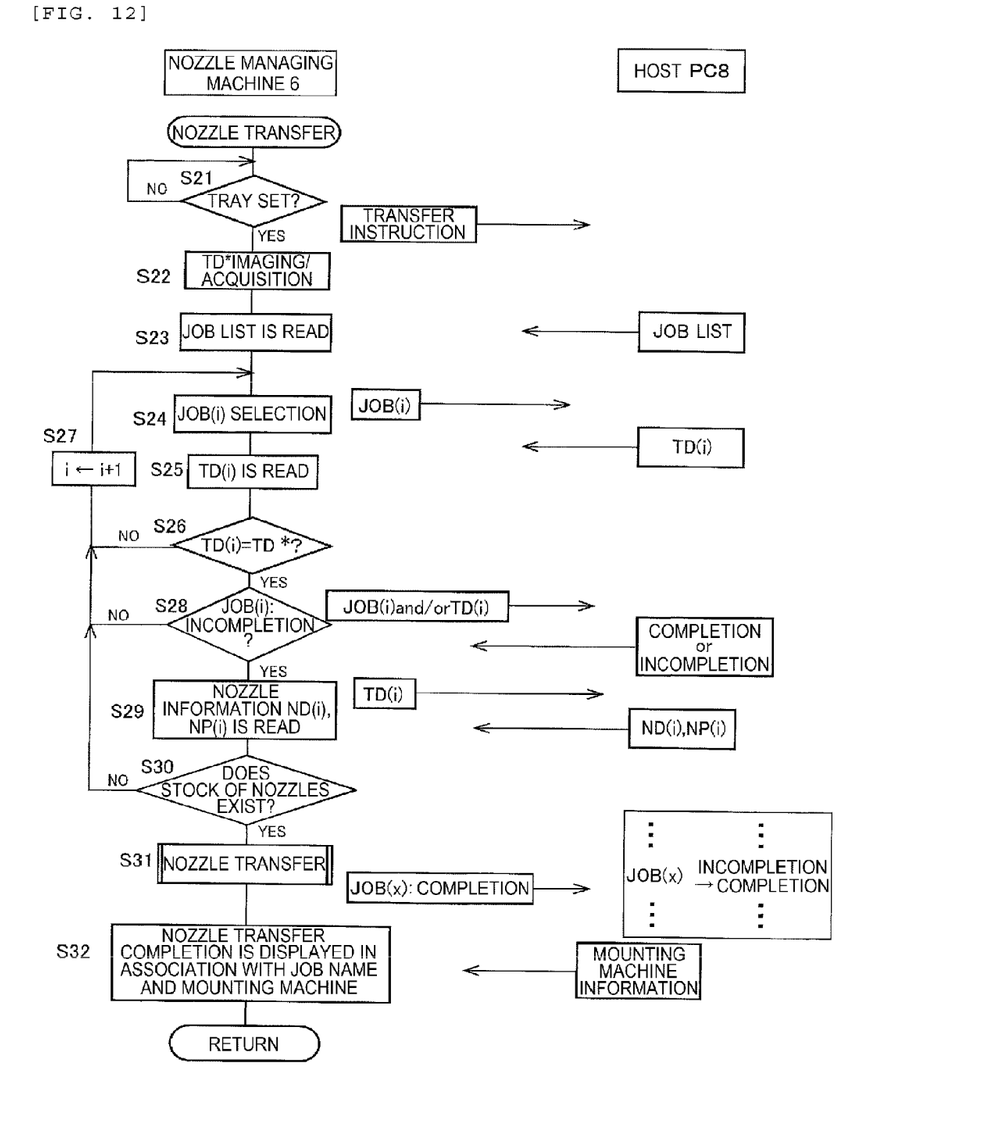
FIG. 12 is a flowchart indicating a nozzle transfer program stored in the memory section of the nozzle managing machine.

The nozzle transfer program illustrated in flowchart of FIG. 12 is executed in the nozzle managing machine 6.

In step 21 (hereinafter, abbreviated as S21. The same applied to other steps), it is determined whether or not the trays T are set in the tray holding sections 168 and 170. For example, it is possible to determine whether or not the trays T are set by the presence or absence of an input (for example, nozzle transfer instruction) of the operator via the input device 254. In S22, the transfer head 200 is moved, the tray T is imaged by the camera 222, and the tray information TD is acquired {for example, acquired tray information is referred to as TD*}. In S23, the JOB list illustrated in FIG. 11(b) transmitted from the host PC 8 is read. For example, list request information or nozzle transfer instruction information is transmitted from the nozzle managing machine 6 to the host PC 8, and accordingly the JOB list can be supplied.

In S24, one at a head of JOBs in which the nozzle transfer completion information is "uncompleted" is selected from the JOB list and the JOB name (for example, JOB(2)) thereof is transmitted to the host PC 8. In the example, the JOB name {JOB(2)} is defined as a JOB counter is 2 (i=2). The host PC 8 selects the tray information TD(2) included in JOB(2) information in which the JOB name is JOB(2) from the production managing JOB information illustrated in FIG. 11(a) {hereinafter, may be simply referred to as the tray information TD(2) corresponding to JOB(2)}, and the tray information TD(2) is transmitted to the nozzle managing machine 6. In S25 and 26, in the nozzle managing machine 6, the tray information TD(2) that is received and the tray information TD* acquired in S22 are compared and it is determined whether or not they match. If they do not match, in S27, the JOB counter is increased by 1 and the procedure proceeds to S24, and JOB(3) is selected. It is determined whether or not the tray information TD(3) corresponding to JOB(3) and TD* match by executing S24 to 26. Hereinafter, S24 to 27 are repeatedly executed until TD* and the tray information TD(i) transmitted from the host PC 8 match.

Therefore, in a case where TD(i) {for example, i=x} and TD* match, the determination of S26 is YES and the JOB name {JOB(x)} is transmitted from the nozzle managing machine 6 to the host PC 8. The host PC 8 selects and transmits the nozzle transfer completion information (completion or incompletion) corresponding to JOB(x). In the nozzle managing machine 6, in S28, it is determined whether or not the transmitted nozzle transfer completion information is "incompletion". If it is "incompletion", the determination is YES and S29 is executed, but if it is "completion", in S27, the JOB counter is increased by 1, and the procedure proceeds to S24. Hereinafter, S24 to 28 are repeatedly executed, the same tray information TD(i) as TD* is included, and JOB information in which the nozzle transfer completion information is "incompletion" is searched.

In a case where the nozzle transfer completion information corresponding to JOB(x) is "incompletion", the determination of S28 is YES and the JOB(x) name is transmitted from the nozzle managing machine 6 to the host PC 8. The host PC 8 transmits the nozzle information {ND(i) and NP(i)} corresponding to JOB(x) and the like. In the nozzle managing machine 6, in S29, the nozzle information {ND(i) and NP(i)} and the like are read, and in S30, the presence or absence of stock of the nozzles N is determined on the basis of the nozzle managing information illustrated in FIG. 9. It is determined whether or not the required number or more of the nozzles N of the types indicated by the nozzle type information ND(x) of the nozzle information {ND(i) and NP (i)} are accommodated in the palette accommodation device 74. In a case where the stock of the nozzles N does not exist, in S27, the JOB counter is increased by 1, S24 to 30 are repeatedly executed, the same type of the tray T as TD* is used, nozzle transfer completion information is "incompletion", and the JOB information in which the stock of the nozzles exists is searched.

In a case where the stock of the nozzles exists for JOB (x), the determination of S30 is YES and in S31, the transfer of the nozzle N is performed on the basis of the nozzle information {ND(x) and NP(x)}. When the transfer of the nozzle N is completed, the nozzle transfer completion information in which the JOB(x) name is "completion" is transmitted from the nozzle managing machine 6 to the host PC 8. In the host PC 8, in the production plan JOB information illustrated in FIG. 11(a), the nozzle transfer completion information corresponding to JOB (x) is changed from "incompletion" to "completion" and is stored. In addition, the mounting machine information corresponding to JOB (x) is transmitted to the nozzle managing machine 6. In the nozzle managing machine 6, the mounting machine information is received and in S32, the fact that the nozzle transfer is completed is displayed on the display 252 in association with the JOB name {JOB(x)} and the mounting machine 4x.

The operator confirms the display of the display 252, removes the tray T from the tray holding sections 168 and 170, places the tray T on a wheeled table in the vicinity of the mounting machine 4x, and can make the tray T which is used in the mounting machine 4x in an easily recognizable state such as attaching a card (memo). In a case where the mounting work is completed in the mounting machine 4x, the tray T can be exchanged satisfactorily.

In addition, in the embodiment described above, a case where one tray T is set in one of the tray holding sections 168 and 170 is described, but the same is applied to a case where the tray T is set in each of the both sections. The nozzle transfer program can be sequentially executed for each of the trays T.

Furthermore, in the embodiment described above, a case where the tray information included in the JOB(i) information is one is described, but multiple types information may be included. In this case, nozzle transfer completion information is stored for each type of tray information. In a case where at least one type of the nozzle transfer completion information corresponding to each type of multiple types of tray information is "incompletion", the nozzle transfer completion information corresponding to the JOB name of the JOB list is "incompletion". In S28, the nozzle transfer completion information corresponding to the JOB name is acquired from the JOB list and the nozzle transfer completion information corresponding to each type of the tray information may be acquired from the production plan JOB information, and the nozzle transfer is performed similar to that of the case of the embodiment described above.

As described above, in the example, the operator may set the trays T to the tray holding sections 168 and 170 and the transfer of the nozzle N suitable for the set tray T is automatically performed. As a result, the operator does not need to perform troublesome work such as replacement and placing of the nozzle, and it is possible to shorten the time required for the setup change. In addition, it is possible to prevent the nozzle from being erroneously placed.

In addition, the nozzle information {ND(i) and NP(i)} is determined on the basis of next work information that is JOB information excluding JOB information in which nozzle transfer completion information is "completion" from the production plan JOB information. Therefore, it is possible to preferably prevent the transfer of the overlapping nozzles for the tray T of the same type.

Figure 9:
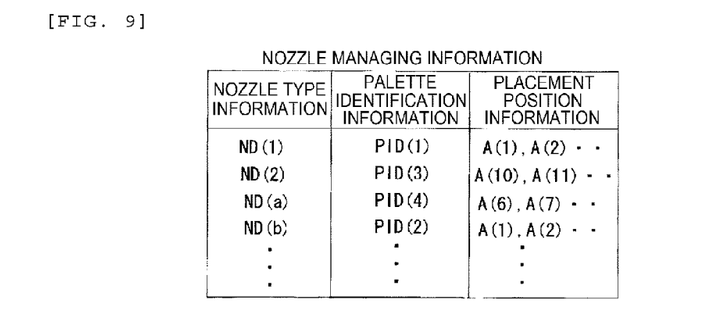
FIG. 9 is a diagram conceptually illustrating information about nozzles stored in a memory section of a control device of the nozzle managing machine.

Furthermore, in the nozzle managing machine 6, as illustrated in FIG. 9, the nozzle managing information is stored. Therefore, for example, in a case where the stock is small for nozzles Na of a type indicated by the nozzle type information ND(a) corresponding to the tray T, or the stock is large for nozzles Nb of a type indicated by the nozzle type information ND(b), if information indicating that either of ND(a) and ND(b) may be included in the nozzle information, the nozzles Nb can be placed instead of the nozzles Na. A situation in which the stock of the nozzles of the type indicated by the nozzle type information ND(a) does not exist can be unlikely to occur, and it is possible to preferably perform stock management of the nozzles N.

In addition, in a case where the transfer of the nozzle N is completed, the completion of the transfer of the nozzle N is displayed in association with the mounting machine in which the tray T is used. Therefore, it is possible to preferably set the tray T to the mounting machine corresponding thereto.

Hereinafter, in the example, the nozzle managing system is configured of the nozzle managing machine 6, the host PC 8, and the like, and a nozzle transfer control device is configured of the control device 14 of the nozzle managing machine 6 and the host PC 8. In addition, in the nozzle transfer control device, a work plan information memory section is configured of the memory section 262 of the host PC 8 and the like, and a transfer control section relaying on next work plan information is configured of a portion that stores S24 to 29, and 31 of the control device 14, a portion that executes those, and the like.

Moreover, in the embodiment described above, in the nozzle managing machine 6, the nozzle information {ND(i) and NP(i)} corresponding to the tray T is determined by the communication (production plan JOB information) with the host PC 8, but it is possible to store the production plan JOB information in the nozzle managing machine 6 in advance. In this case, it is not necessary to perform the communication with the host PC 8.

In addition, the tray information TD of the trays T that are set in the tray holding sections 168 and 170 is transmitted from the nozzle managing machine 6 to the host PC 8, the nozzle information {ND(i) and NP(i)} is determined in the host PC 8, and can be transmitted to the nozzle managing machine 6. As described above, the execution (role assignment) of each of the nozzle managing machine 6 and the host PC 8 is not limited to the embodiment described above, and any execution may be performed in either case.

In addition, the production plan JOB information and the JOB list are not limited to the host PC 8 and can be stored in an external device connected to the bus 10 and the like. Furthermore, a PC is directly connected to the nozzle managing machine 6 and, the production plan JOB information and the JOB list are stored in the PC.

Second Embodiment

In the second embodiment, nozzle information {ND(i) and NP(i)} is determined in a host PC 8 and is supplied to a nozzle managing machine 6 on the basis of an input of an operator and production plan JOB information. Information capable of determining the nozzle information {ND(i) and NP(i)}, for example, a JOB name, JOB name and mounting machine information can be selected or input by the operator.

Figure 13:
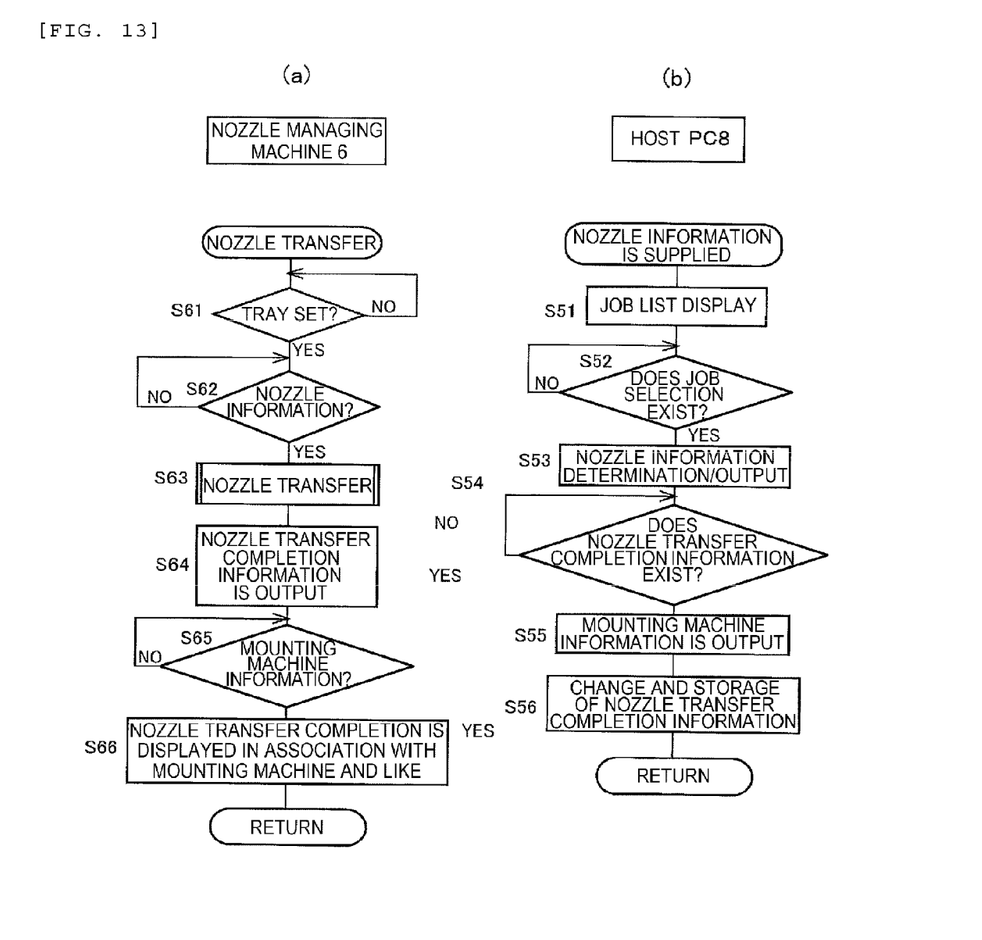
FIG. 13 is a flowchart indicating a nozzle transfer program stored in a nozzle managing machine of a nozzle managing system of a second embodiment.

A nozzle transfer program indicated by a flowchart of FIG. 13(*a*) is executed in the nozzle managing machine 6 and a nozzle information supply program indicated by a flowchart of FIG. 13(*b*) is executed in the host PC 8.

In the host PC 8, in S51, a JOB list is displayed in a display 266. In S52, an input (selection) by the operator is awaited. In a case where a JOB name {JOB(x)} is selected by the operator, in S53, nozzle information {ND(x) and NP(x)} corresponding to JOB(x) is selected and is transmitted to the nozzle managing machine 6. Thereafter, in S54, a supply (reception) of nozzle transfer completion information is awaited.

In the nozzle managing machine 6, in S61, it is determined whether or not a tray T is set in one of tray holding sections 168 and 170. In a case where the tray T is set, in S62, the supply of the nozzle information {ND(i) and NP(i)} is awaited. In a case where the nozzle information {ND(x) and NP(x)} is supplied from the host PC 8, in S63, the transfer of the nozzle is performed on the basis of the nozzle information {ND(x) and NP(x)}. In a case where the transfer of the nozzle is completed, in S64, nozzle transfer completion information of "completion" is transmitted and in S65, a supply of mounting machine information is awaited.

In the host PC 8, when the nozzle transfer completion information is received, a determination of S54 is YES and in S55, the mounting machine information corresponding to JOB(x) is transmitted. In S56, the nozzle transfer completion information corresponding to JOB(x) is changed from "incompletion" to "completion" and stored.

In the nozzle managing machine 6, when the mounting machine information is supplied, the determination of S65 is YES and in S66, a fact that the nozzle transfer is completed is displayed in association with the mounting machine.

As described above, also in the example, the operator does not need to perform troublesome work such as replacement of the nozzle, and can suitably place the nozzle corresponding to the tray T.

Moreover, in the example, in a case where a stock of the nozzles does not exist, the fact can be notified. The operator can again select another JOB. In addition, information indicating that the stock of the nozzles does not exist is transmitted to the host PC 8 and in the host PC 8, other nozzle information {ND(i) and NP(i)} can also be searched.

In addition, the JOB list is displayed in a display 252 of the nozzle managing machine 6 and in the nozzle managing machine 6, an input of the operator can also be performed.

Above, in the example, a nozzle management control device relying on input information is configured of the control device 14 and the host PC.

Moreover, the nozzle managing machine 6 is not limited to the nozzle transfer for a setup change and for example, in a case where mounting work is completed, for a tray T after being used, even if the nozzles N are transferred to a palette P and are stored in a palette accommodation device 74, the disclosure can be applied.

For example, the operator removes the tray T in which the nozzles N which are used are stored from the mounting machine, sets the tray T in a tray holding section 168, and selects or inputs a JOB name corresponding to the tray T. In the nozzle managing machine 6, the nozzles N placed in the tray T are transferred to the palette P. In this case, nozzle type information ND(i) of the nozzle N transferred to the palette P and the like can be acquired from the nozzle information {ND(i) and NP(i)} corresponding to the tray T. There is an advantage that it becomes unnecessary to image the nozzle N by a transfer head 200 and read an ND code every time.

In addition, the disclosure can be implemented in various modes in which various modifications and improvements are made on the basis of knowledge of those skilled in the art in addition to the examples described above.

REFERENCE SIGNS LIST

6: nozzle managing machine, 8: host PC, 10: bus; 14: control device; N: nozzle; T: tray T; P: palette; 74: palette accommodation device; 76: tray accommodation device; 78: nozzle transfer device; 80: palette moving device; 82: tray moving device; 218: chuck; 222: camera; 244: execution section; 246: memory section; 252: display; 254: input device; 260: CPU; 262: memory section; 264: input device; 266: display

The invention claimed is:

1. A nozzle managing system comprising:
   a nozzle managing machine that includes (a) a nozzle stocker that stores multiple suction nozzles which can be used for mounting work of electric components performed in a mounting machine, (b) a nozzle placing device transfer holding section that detachably holds a nozzle placing device which is used in the mounting machine, and in which the multiple suction nozzles can be placed, and (c) a nozzle transfer device that performs transfer of the suction nozzles between the nozzle placing device held in the nozzle placing device transfer holding section and the nozzle stocker; and
   a nozzle transfer control device that includes a work plan information memory section that stores work plan information that is information about a plan of the mounting work performed in the mounting machine, acquires nozzle information that is information about the suction nozzles corresponding to the nozzle placing device on the basis of the work plan information stored in the work plan information memory section and nozzle placing device information that is information indicating the nozzle placing device and acquired in a state of being held in the nozzle placing device transfer holding section, and controls the nozzle transfer device on the basis of the nozzle information.

2. The nozzle managing system according to claim 1,
   wherein the mounting machine includes a nozzle placing device mounting holding section that detachably holds the nozzle placing device and performs the mounting work using the suction nozzles that are placed in the nozzle placing device held in the nozzle placing device mounting holding section,
   wherein the work plan information includes multiple types of (a) mounting machine information that indicates the mounting machine, (b) the nozzle placing device information that indicates the nozzle placing device held in the nozzle placing device mounting holding section that is included in the mounting machine indicated by the mounting machine information, and (c) work information that has nozzle information indicating the one or more suction nozzles that are placed in the nozzle placing device indicated by the nozzle placing device information and held in the nozzle placing device mounting holding section, and are used in the mounting work of the mounting machine indicated by the mounting machine information, and
   wherein the nozzle managing system includes a notifying device that notifies completion of the transfer of the suction nozzles in association with at least the mounting machine including the nozzle placing device mounting holding section in which the nozzle placing device is held in a case where the transfer of the suction nozzles is completed by the nozzle transfer device.

3. The nozzle managing system according to claim 1,
   wherein the mounting machine includes a nozzle placing device mounting holding section that detachably holds the nozzle placing device and performs the mounting work using the suction nozzles that are placed in the nozzle placing device held in the nozzle placing device mounting holding section,
   wherein the work plan information includes multiple types of (a) mounting machine information that indicates the mounting machine, (b) the nozzle placing device information that indicates the nozzle placing device held in the nozzle placing device mounting holding section that is included in the mounting machine indicated by the mounting machine information, and (c) work information that has nozzle information indicating the one or more suction nozzles that are placed in the nozzle placing device indicated by the nozzle placing device information and held in the nozzle placing device mounting holding section, and are used in the mounting work of the mounting machine indicated by the mounting machine information, and
   wherein the nozzle transfer control device includes a transfer control section relying on next work plan information that controls the nozzle transfer device on the basis of next work plan information that is information excluding the work information about the nozzle transfer device in which the transfer of the suction nozzles is completed by the nozzle transfer device from the work plan information.

4. A nozzle managing system comprising:
a nozzle managing machine that includes (a) a nozzle stocker that stores multiple suction nozzles which can be used for mounting work of electric components performed in a mounting machine, (b) a nozzle placing device transfer holding section that detachably holds a nozzle placing device in which the multiple suction nozzles can be placed, and (c) a nozzle transfer device that performs transfer of the suction nozzles between the nozzle placing device held in the nozzle placing device transfer holding section and the nozzle stocker; and
a nozzle transfer control device relying on input information that includes (i) a work plan information memory section that stores work plan information that is information about a plan of the mounting work performed in the mounting machine, and (ii) an input device that can be operated by an operator, acquires nozzle information that is information indicating the suction nozzles corresponding to the nozzle placing device held in the nozzle placing device transfer holding section on the basis of the work plan information stored in the work plan information memory section and information which is input via the input device and can specify expected mounting work performed in the mounting machine, and controls the nozzle transfer device on the basis of the nozzle information.

* * * * *